(12) United States Patent
Konuma et al.

(10) Patent No.: US 7,847,355 B2
(45) Date of Patent: Dec. 7, 2010

(54) SEMICONDUCTOR DEVICE INCLUDING TRANSISTORS WITH SILICIDED IMPURITY REGIONS

(75) Inventors: Toshimitsu Konuma, Atsugi (JP); Akira Sugawara, Atsugi (JP); Yukiko Uehara, Atsugi (JP); Hongyong Zhang, Yamato (JP); Atsunori Suzuki, Kawasaki (JP); Hideto Ohnuma, Atsugi (JP); Naoaki Yamaguchi, Yokohama (JP); Hideomi Suzawa, Atsugi (JP); Hideki Uochi, Atsugi (JP); Yasuhiko Takemura, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/534,382

(22) Filed: Aug. 3, 2009

(65) Prior Publication Data

US 2009/0289254 A1 Nov. 26, 2009

Related U.S. Application Data

(60) Continuation of application No. 11/078,440, filed on Mar. 14, 2005, now Pat. No. 7,569,856, and a division of application No. 08/307,167, filed on Sep. 16, 1994, now Pat. No. 6,867,431.

(30) Foreign Application Priority Data

| Sep. 20, 1993 | (JP) | ................. | 5-256563 |
| Sep. 20, 1993 | (JP) | ................. | 5-256565 |
| Sep. 20, 1993 | (JP) | ................. | 5-256567 |
| Oct. 19, 1993 | (JP) | ................. | 5-284287 |

(51) Int. Cl.
H01L 29/786 (2006.01)

(52) U.S. Cl. .................. 257/353; 257/59; 257/72; 257/384; 257/408; 257/E29.269; 257/E29.278

(58) Field of Classification Search .............. 257/59, 257/72, 353, 384, 408, E29.269, E29.278
See application file for complete search history.

(56) References Cited

U.S. PATENT DOCUMENTS 3,775,262 A 11/1973 Heyerdahl
(Continued)

FOREIGN PATENT DOCUMENTS

CN 1070052 3/1993
(Continued)

OTHER PUBLICATIONS

Electrochemical Society Spring Meeting, (Extended Abstracts), Toronto, Ont. Canada, May 11-16, 1975, Princeton, NJ USA, Electrochemical Soc, pp. 179-181, XP002020881, Tsunemitsu H: *Selective Anode-Oxidation of Bi-Metallic Layer*.

(Continued)

*Primary Examiner*—Marcos D. Pizarro
(74) *Attorney, Agent, or Firm*—Eric J. Robinson; Robinson Intellectual Property Law Office, P.C.

(57) ABSTRACT

A TFT formed on an insulating substrate source, drain and channel regions, a gate insulating film formed on at least the channel region and a gate electrode formed on the gate insulating film. Between the channel region and the drain region, a region having a higher resistivity is provided in order to reduce an Ioff current. A method for forming this structure comprises the steps of anodizing the gate electrode to form a porous anodic oxide film on the side of the gate electrode; removing a portion of the gate insulating using the porous anodic oxide film as a mask so that the gate insulating film extends beyond the gate electrode but does not completely cover the source and drain regions. Thereafter, an ion doping of one conductivity element is performed. The high resistivity region is defined under the gate insulating film.

27 Claims, 13 Drawing Sheets

U.S. PATENT DOCUMENTS

| | | |
|---|---|---|
| 3,806,778 A | 4/1974 | Shimakura et al. |
| 3,935,083 A | 1/1976 | Tomozawa et al. |
| 3,988,214 A | 10/1976 | Tsunemitsu |
| 3,997,367 A | 12/1976 | Yau |
| 4,040,073 A | 8/1977 | Luo |
| 4,065,781 A | 12/1977 | Gutknecht |
| 4,232,327 A | 11/1980 | Hsu |
| 4,236,167 A | 11/1980 | Woods |
| 4,319,395 A | 3/1982 | Lund et al. |
| 4,336,550 A | 6/1982 | Medwin |
| 4,468,855 A | 9/1984 | Sasaki |
| 4,503,601 A | 3/1985 | Chiao |
| 4,557,036 A | 12/1985 | Kyuragi et al. |
| 4,616,399 A | 10/1986 | Ooka |
| 4,646,426 A | 3/1987 | Sasaki |
| 4,690,730 A | 9/1987 | Tang et al. |
| 4,701,423 A | 10/1987 | Szluk |
| 4,727,044 A | 2/1988 | Yamazaki |
| 4,728,617 A | 3/1988 | Woo et al. |
| 4,746,628 A | 5/1988 | Takafuji et al. |
| 4,753,896 A | 6/1988 | Matloubian |
| 4,755,865 A | 7/1988 | Wilson et al. |
| 4,772,927 A | 9/1988 | Saito et al. |
| 4,818,715 A | 4/1989 | Chao |
| 4,822,751 A | 4/1989 | Ishizu et al. |
| 4,830,971 A | 5/1989 | Shibata |
| 4,855,247 A | 8/1989 | Ma et al. |
| 4,885,259 A | 12/1989 | Osinski et al. |
| 4,905,066 A | 2/1990 | Dohjo et al. |
| 4,908,326 A | 3/1990 | Ma et al. |
| 4,942,441 A | 7/1990 | Konishi et al. |
| 4,943,837 A | 7/1990 | Konishi |
| 4,971,922 A | 11/1990 | Watabe et al. |
| 4,978,626 A | 12/1990 | Poon et al. |
| 5,024,960 A | 6/1991 | Haken |
| 5,075,674 A | 12/1991 | Katayama et al. |
| 5,097,301 A | 3/1992 | Sanchez |
| 5,097,311 A | 3/1992 | Iwase et al. |
| 5,100,810 A | 3/1992 | Yoshimi et al. |
| 5,126,283 A | 6/1992 | Pintchovski et al. |
| 5,134,093 A | 7/1992 | Onishi et al. |
| 5,142,344 A | 8/1992 | Yamazaki |
| 5,146,291 A | 9/1992 | Watabe |
| 5,151,374 A | 9/1992 | Wu |
| 5,162,263 A | 11/1992 | Kunishima et al. |
| 5,165,075 A | 11/1992 | Hiroki et al. |
| 5,168,332 A | 12/1992 | Kunishima et al. |
| 5,182,619 A | 1/1993 | Pfiester |
| 5,200,846 A | 4/1993 | Hiroki et al. |
| 5,227,321 A | 7/1993 | Lee et al. |
| 5,231,038 A | 7/1993 | Yamaguchi et al. |
| 5,236,865 A | 8/1993 | Sandhu et al. |
| 5,238,859 A | 8/1993 | Kamijo |
| 5,241,193 A | 8/1993 | Pfiester et al. |
| 5,250,931 A | 10/1993 | Misawa et al. |
| 5,252,502 A | 10/1993 | Havemann |
| 5,254,866 A | 10/1993 | Ogoh |
| 5,258,319 A | 11/1993 | Inuishi et al. |
| 5,274,279 A | 12/1993 | Misawa et al. |
| 5,286,659 A | 2/1994 | Mitani et al. |
| 5,287,205 A | 2/1994 | Yamazaki et al. |
| 5,289,030 A | 2/1994 | Yamazaki et al. |
| 5,292,675 A | 3/1994 | Codama |
| 5,306,651 A | 4/1994 | Masumo et al. |
| 5,308,998 A | 5/1994 | Yamazaki et al. |
| 5,323,042 A * | 6/1994 | Matsumoto ................ 257/350 |
| 5,341,012 A | 8/1994 | Misawa et al. |
| 5,341,028 A | 8/1994 | Yamaguchi et al. |
| 5,372,958 A | 12/1994 | Miyasaka et al. |
| 5,403,762 A | 4/1995 | Takemura |
| 5,407,837 A | 4/1995 | Eklund |
| 5,412,493 A | 5/1995 | Kunii et al. |
| 5,430,320 A | 7/1995 | Lee |
| 5,459,090 A | 10/1995 | Yamazaki et al. |
| 5,468,987 A | 11/1995 | Yamazaki et al. |
| 5,474,945 A | 12/1995 | Yamazaki et al. |
| 5,475,244 A | 12/1995 | Koizumi et al. |
| 5,485,019 A | 1/1996 | Yamazaki et al. |
| 5,492,843 A | 2/1996 | Adachi et al. |
| 5,495,121 A | 2/1996 | Yamazaki et al. |
| 5,508,209 A | 4/1996 | Zhang et al. |
| 5,514,879 A | 5/1996 | Yamazaki |
| 5,521,107 A | 5/1996 | Yamazaki et al. |
| 5,543,340 A | 8/1996 | Lee |
| 5,545,571 A | 8/1996 | Yamazaki et al. |
| 5,561,075 A | 10/1996 | Nakazawa |
| 5,563,440 A | 10/1996 | Yamazaki et al. |
| 5,572,046 A | 11/1996 | Takemura |
| 5,576,231 A | 11/1996 | Konuma et al. |
| 5,576,556 A | 11/1996 | Takemura et al. |
| 5,583,347 A | 12/1996 | Misawa et al. |
| 5,583,366 A | 12/1996 | Nakazawa |
| 5,591,990 A | 1/1997 | Misawa et al. |
| 5,598,025 A | 1/1997 | Murakoshi et al. |
| 5,604,137 A | 2/1997 | Yamazaki et al. |
| 5,608,251 A | 3/1997 | Konuma et al. |
| 5,616,936 A | 4/1997 | Misawa et al. |
| 5,619,045 A | 4/1997 | Konuma et al. |
| 5,623,157 A | 4/1997 | Miyazaki et al. |
| 5,627,084 A | 5/1997 | Yamazaki et al. |
| 5,648,277 A | 7/1997 | Zhang et al. |
| 5,648,685 A | 7/1997 | Misawa et al. |
| 5,650,338 A | 7/1997 | Yamazaki et al. |
| 5,656,826 A | 8/1997 | Misawa et al. |
| 5,663,570 A | 9/1997 | Reedy et al. |
| 5,672,900 A | 9/1997 | Konuma et al. |
| 5,677,212 A | 10/1997 | Misawa et al. |
| 5,686,328 A | 11/1997 | Zhang et al. |
| 5,714,771 A | 2/1998 | Misawa et al. |
| 5,736,414 A | 4/1998 | Yamaguchi |
| 5,754,158 A | 5/1998 | Misawa et al. |
| 5,773,846 A | 6/1998 | Zhang et al. |
| 5,780,872 A | 7/1998 | Misawa et al. |
| 5,789,762 A | 8/1998 | Koyama et al. |
| 5,804,878 A | 9/1998 | Miyazaki et al. |
| 5,811,837 A | 9/1998 | Misawa et al. |
| 5,814,539 A | 9/1998 | Nakazawa |
| 5,849,611 A | 12/1998 | Yamazaki et al. |
| 5,888,888 A | 3/1999 | Talwar et al. |
| 5,904,509 A | 5/1999 | Zhang et al. |
| 5,904,511 A | 5/1999 | Misawa et al. |
| 5,913,112 A | 6/1999 | Yamazaki et al. |
| 5,939,731 A | 8/1999 | Yamazaki et al. |
| 5,945,711 A | 8/1999 | Takemura et al. |
| RE36,314 E | 9/1999 | Yamazaki et al. |
| 5,962,870 A | 10/1999 | Yamazaki et al. |
| 5,962,872 A | 10/1999 | Zhang et al. |
| 5,962,897 A | 10/1999 | Takemura et al. |
| 5,985,741 A | 11/1999 | Yamazaki et al. |
| 6,013,928 A | 1/2000 | Yamazaki et al. |
| 6,031,290 A | 2/2000 | Miyazaki et al. |
| 6,049,092 A | 4/2000 | Konuma et al. |
| 6,136,625 A | 10/2000 | Nakazawa |
| 6,166,414 A | 12/2000 | Miyazaki et al. |
| 6,218,678 B1 | 4/2001 | Zhang et al. |
| 6,255,214 B1 | 7/2001 | Wieczorek et al. |
| 6,259,120 B1 | 7/2001 | Zhang et al. |
| 6,410,373 B1 | 6/2002 | Chang et al. |
| 6,441,433 B1 | 8/2002 | En et al. |
| 6,448,612 B1 | 9/2002 | Miyazaki et al. |
| 6,486,497 B2 | 11/2002 | Misawa et al. |
| 6,489,632 B1 | 12/2002 | Yamazaki et al. |
| 6,566,213 B2 | 5/2003 | En et al. |
| 6,700,135 B2 | 3/2004 | Misawa et al. |

| | | | |
|---|---|---|---|
| 6,777,763 B1 | 8/2004 | Zhang et al. | |
| 6,995,432 B2 | 2/2006 | Yamazaki et al. | |
| 7,112,495 B2 | 9/2006 | Ko et al. | |
| 7,223,666 B2 | 5/2007 | Ohtani et al. | |
| 7,238,988 B2 | 7/2007 | Inoh et al. | |
| 7,381,599 B2 | 6/2008 | Konuma et al. | |
| 7,408,233 B2 | 8/2008 | Yamazaki et al. | |
| 7,488,982 B2 | 2/2009 | So et al. | |
| 7,525,158 B2 | 4/2009 | Konuma et al. | |
| 2006/0115948 A1 | 6/2006 | Tokunaga | |

FOREIGN PATENT DOCUMENTS

| | | |
|---|---|---|
| EP | 0 197 738 | 10/1986 |
| EP | 0 072 216 | 4/1989 |
| EP | 0 342 925 | 11/1989 |
| EP | 0 480 635 | 4/1992 |
| EP | 0 487 220 | 5/1992 |
| EP | 487220 A2 * | 5/1992 |
| EP | 0 501 561 | 9/1992 |
| EP | 0 502 749 | 9/1992 |
| EP | 0 513 590 | 11/1992 |
| EP | 0 609 919 | 8/1994 |
| EP | 0 610 969 | 8/1994 |
| EP | 0 617 309 | 9/1994 |
| EP | 0 645 802 | 3/1995 |
| EP | 0 650 197 | 4/1995 |
| EP | 0 806 700 | 11/1997 |
| EP | 0 806 701 | 11/1997 |
| EP | 0 806 702 | 11/1997 |
| EP | 1 227 469 | 7/2002 |
| EP | 1 564 799 | 8/2005 |
| EP | 1 564 800 | 8/2005 |
| JP | 50-108137 | 8/1975 |
| JP | 54-070762 | 6/1979 |
| JP | 54-161282 | 12/1979 |
| JP | 58-023479 | 2/1983 |
| JP | 58-037967 | 3/1983 |
| JP | 58-095814 | 6/1983 |
| JP | 58-105574 | 6/1983 |
| JP | 58105574 A * | 6/1983 |
| JP | 58-118154 | 7/1983 |
| JP | 58-142566 | 8/1983 |
| JP | 59-110115 | 6/1984 |
| JP | 59-220971 | 12/1984 |
| JP | 60-055665 | 3/1985 |
| JP | 60-186053 | 9/1985 |
| JP | 60-202931 | 10/1985 |
| JP | 61-224360 | 10/1986 |
| JP | 62-032653 | 2/1987 |
| JP | 63-066969 | 3/1988 |
| JP | 63-178560 | 7/1988 |
| JP | 64-007567 | 1/1989 |
| JP | 64-021919 | 1/1989 |
| JP | 01-114070 | 5/1989 |
| JP | 01-183853 | 7/1989 |
| JP | 01-289917 | 11/1989 |
| JP | 02-028377 A | 1/1990 |
| JP | 02-042419 | 2/1990 |
| JP | 02-159730 | 6/1990 |
| JP | 02-162738 | 6/1990 |
| JP | 02-246277 | 10/1990 |
| JP | 02-280371 | 11/1990 |
| JP | 02-306664 | 12/1990 |
| JP | 02-307273 | 12/1990 |
| JP | 03-020084 | 1/1991 |
| JP | 03-024735 | 2/1991 |
| JP | 03-034433 | 2/1991 |
| JP | 03-038755 | 6/1991 |
| JP | 03-142418 | 6/1991 |
| JP | 03-196529 | 8/1991 |
| JP | 03-203322 | 9/1991 |
| JP | 03-227068 | 10/1991 |
| JP | 04-121914 | 4/1992 |
| JP | 04-196328 | 7/1992 |
| JP | 04-287025 | 10/1992 |
| JP | 04-290475 | 10/1992 |
| JP | 04-305939 | 10/1992 |
| JP | 04-360580 | 12/1992 |
| JP | 05-021801 | 1/1993 |
| JP | 05-055255 | 3/1993 |
| JP | 05-082553 | 4/1993 |
| JP | 05-090512 | 4/1993 |
| JP | 05-114724 | 5/1993 |
| JP | 05-152326 | 6/1993 |
| JP | 05-152329 | 6/1993 |
| JP | 05-160153 | 6/1993 |
| JP | 05-166837 | 7/1993 |
| JP | 05-173179 | 7/1993 |
| JP | 05-175230 | 7/1993 |
| JP | 05-226364 | 9/1993 |
| JP | 05-275448 | 10/1993 |
| JP | 05-275449 | 10/1993 |
| JP | 05-315355 | 11/1993 |
| JP | 06-013397 | 1/1994 |
| JP | 06-053509 | 2/1994 |
| JP | 06-124962 | 5/1994 |
| JP | 06-267982 | 9/1994 |
| JP | 06-338612 | 12/1994 |
| JP | 07-140485 | 6/1995 |
| JP | 07-169974 | 7/1995 |
| JP | 07-169975 | 7/1995 |
| JP | 07-218932 | 8/1995 |
| JP | 09-181329 | 7/1997 |
| JP | 2002-033328 | 1/2002 |
| JP | 2002-033329 | 1/2002 |

OTHER PUBLICATIONS

A.K. Agarwal et al., "Microx-An All Silicon Microwave Technology," Proceedings of the International SOI Conference, Ponte Vedra Beach, FL, Oct. 6-8, 1992, Institute of Electronics Engineers, pp. 144-145.

Shin-En Wu et al., "On the Design Consideration of Ultra-Thin-Film SOI Mosfets," Proceedings of the International SOI Conference, Vail Valley, Colorado, Oct. 1-3, 1991, Institute of Electrical and Electronics Engineers, pp. 76-77, XP000586765.

European Search Report, (Partial), dated Jan. 27, 1998, for Application No. 94306862.7, 9 pages.

European Search Report dated Nov. 14, 2005 for Application No. 05006907.9.

European Search Report dated Nov. 14, 2005 for Application No. 05006906.1.

Wolf, Silicon Processing for the VLSI Era, vol. 2: Process Integration, Lattice Press, 1990, pp. 144-152.

Office Action (Application No. 200510054408.8) dated Aug. 24, 2007.

* cited by examiner

SEMICONDUCTOR DEVICE INCLUDING TRANSISTORS WITH SILICIDED IMPURITY REGIONS

BACKGROUND OF THE INVENTION

The present invention relates to a semiconductor device and a manufacturing method thereof, in particular, the present invention is directed to an insulated gate field effect transistor of a thin film type formed on an insulating surface which may be a surface of an insulating substrate such as glass or an insulating film such as silicon oxide formed on a silicon wafer. Specifically, the present invention is applicable to a manufacture of a TFT (thin film transistor) formed on a glass substrate of which glass transition temperature (which is also called distortion point or distortion temperature) is 750° C. or lower.

The semiconductor device manufactured in accordance with the present invention is applicable to a driving circuit for an active matrix device such as a liquid crystal display or an image sensor, or a three dimensional integrated circuit.

TFTs have been well known to drive an active matrix type liquid crystal device or an image sensor. specifically, instead of amorphous TFTs having an amorphous silicon as an active layer thereof, crystalline Si TFTs have been developed in order to obtain a higher field mobility. FIGS. 6A-6F are cross sections showing a manufacturing method of a TFT in accordance with a prior art.

Referring to FIG. 6A, a base film 602 and an active layer 603 of crystalline silicon are formed on a substrate 601. An insulating film 604 is formed on the active layer using silicon oxide or, the like.

Then, a gate electrode 605 is formed from phosphorous doped polysilicon, tantalum, titanium, aluminum, etc. With this gate electrode used as a mask, an impurity element (e.g. phosphorous or boron) is doped into the active layer 603 through an appropriate method such as ion-doping in a self-aligning manner, thereby, forming impurity regions 606 and 607 containing the impurity at a relatively lower concentration and therefore having a relatively high resistivity. These regions 606 and 607 are called a high resistivity region (HRD: High Resistivity Drain) by the present inventors hereinafter. The region of the active layer below the gate electrode which is not doped with the impurity will be a channel region. After that, the doped impurity is activated using laser or a heat source such as a flush lamp. (FIG. 6B)

Referring to FIG. 6C, an insulating film 608 of silicon oxide is formed through a plasma CVD or APCVD (atmospheric pressure CVD), following which an anisotropic etching is performed to leave an insulating material 609 adjacent to the side surfaces of the gate electrode as shown in FIG. 6D.

Then, using the gate electrode 605 and the insulating material 609 as a mask, an impurity element is again added into a portion of the active layer 603 by an ion doping method or the like in a self-aligning manner, thereby, forming a pair of impurity regions 610 and 611 containing the impurity element at a higher concentration and having a lower resistivity. Then, the impurity element is again activated using laser or flush lamp. (FIG. 6E)

Finally, an inter layer insulator 612 is formed on the whole surface, in which contact holes are formed on the source and drain regions 610 and 611. Electrode/wirings 613 and 614 are then formed through the contact holes to contact the source and drain regions. (FIG. 6F)

The foregoing process was achieved by copying the old LDD technique for a conventional semiconductor integrate circuit and this method has some disadvantages for a thin film process on a glass substrate as discussed below.

Initially, it is necessary to activate the added impurity element with laser or flush lamp two times. For this reason, the productivity is lowered. In the case of a conventional semiconductor circuit, the activation of an impurity can be carried out by a heat annealing at one time after completely finishing the introduction of the impurity.

However, in the case of forming TFTs on a glass substrate, the high temperature of the heat annealing tends to damage the glass substrate. Therefore, the use of laser annealing or flush lamp annealing is necessary. However, these annealing is effected on the active layer selectively, that is, the portion of the active layer below the insulating material 609 is not annealed, for example. Accordingly, the annealing step should be carried out at each time after an impurity doping is done.

Also, it is difficult to form the insulating material 609. Generally, the insulating film 608 is as thick as 0.5 to 2 μm while the base film 602 on the substrate is 1000-3000 Å thick. Accordingly, there is a danger that the base layer 602 is unintentionally etched and the substrate is exposed when etching the insulating film 608. As a result, a production yield can not be increased because substrates for TFTs contain a lot of elements harmful for silicon semiconductors.

Further, it is difficult to control the thickness of the insulating material 609 accurately. The anisotropic etching is performed by a plasma dry etching, such as a reactive ion etching (RIE). However, because of the use of a substrate having an insulating surface as is different from the use of a silicon substrate in a semiconductor integrated circuit, the delicate control of the plasma is difficult. Therefore, the formation of the insulating material 609 is difficult.

Since the above HRD should be made as thin as possible, the above difficulty in precisely controlling the formation of the insulating material 609 makes it difficult to mass produce the TFT with a uniform quality. Also, the necessity of performing the ion doping twice makes the process complicated.

BRIEF SUMMARY OF THE INVENTION

An object of the present invention is to solve the foregoing problems and provide a TFT having a high resistivity region (HRD) through a simplified process. Here, the HRD includes not only a region which contains an impurity at a relatively low concentration and has a relatively high resistivity, but also includes a region which has a relatively high resistivity because of an addition of an element for preventing the activation of the dopant impurity even though the concentration of the dopant impurity is relatively high. Examples of such element are carbon, oxygen and nitrogen.

In accordance with the present invention, a surface of a gate electrode is oxidized and this oxide layer is used to define the high resistivity region. The oxide layer is formed, for example, by anodic oxidation. The use of the anodic oxidation to form the oxide layer is advantageous as compared with the anisotropic etching mentioned above because the thickness of the anodic oxide layer can be precisely controlled and can be formed as thin as 1000 Å or less and as thick as 5000 Å or more with an excellent uniformity.

Further, it is another feature of the present invention that there are two kinds of anodic oxide in the above mentioned anodic oxide layer. One is called a barrier type anodic oxide and the other is called a porous type anodic oxide. The porous anodic oxide layer can be formed when using an acid electrolyte. A pH of the electrolyte is lower than 2.0, for example, 0.8-1.1 in the case of using an oxalic acid aqueous solution.

Because of the strong acidness, the metal film is dissolved during the anodization and the resultant anodic oxide becomes porous. The resistance of such a film is very low so that the thickness of the film can be easily increased. On the other hand, the barrier type anodic oxide is formed using a weaker acid or approximately neutral electrolyte. Since the metal is not dissolved, the resultant anodic oxide becomes dense and highly insulating. An appropriate range of pH of the electrolyte for forming the barrier type anodic oxide is higher than 2.0, preferably, higher than 3, for example, between 6.8 and 7.1.

While the barrier type anodic oxide can not be etched unless a hydrofluoric acid containing etchant is used, the porous type anodic oxide can be selectively etched with a phosphoric acid etchant, which can be used without damaging other materials constructing a TFT, for example, silicon, silicon oxide. Also, both of the barrier type anodic oxide and the porous type anodic oxide are hardly etched by dry etching. In particular, both types of the anodic oxides have a sufficiently high selection ratio of etching with respect to silicon oxide.

The foregoing features of the present invention facilitate the manufacture of a TFT having a HRD.

DESCRIPTION OF THE PREFERRED EMBODIMENTS

Figure 1A:
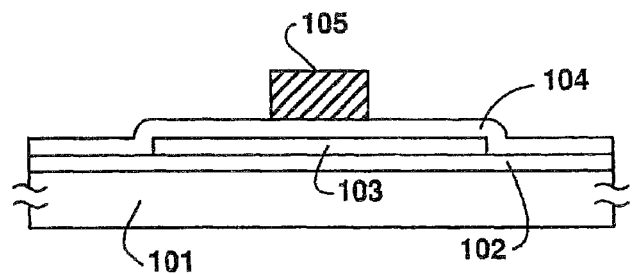
FIGS. 1A-1F are cross sectional views showing a manufacturing method of a TFT in accordance with the Example 1 of the invention.

Referring to FIG. 1A, provided on a substrate 101 is a base insulating film 102. An active layer 103 comprising a crystalline silicon semiconductor is formed on the base insulating film 102. In this invention, "crystalline semiconductor" includes single crystalline, polycrystalline or semiamorphous semiconductor, in which crystal components are contained at least partly Further, an insulating film 104 comprising silicon oxide or the like is formed, covering the active layer 103.

Further, on the insulating film 104, a film comprising an anodizable material is formed. Examples of the anodizable material is aluminum, tantalum, titanium, silicon, etc. These materials can be used singly or in a multilayer form using two or more of them. For example, it is possible to use a double layer structure in which titanium silicide is formed on aluminum, or aluminum is formed on a titanium nitride. The thickness of each layer may be determined in accordance with a required device property. Subsequently, the film is patterned or etched to form a gate electrode 105.

Figure 1B:
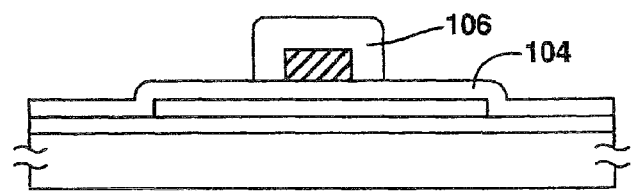

Then, referring to FIG. 1B, the gate electrode 105 is anodized by supplying an electric current thereto in an electrolyte to form a porous anodic oxide 106 on the upper and side surfaces of the gate electrode. As the electrolyte for this anodic oxidation, an acid aqueous solution containing citric acid, oxalic acid, phosphoric acid, chromic acid, or sulfuric acid at 3-20% is used. The applied voltage is 10-30 V and the thickness is 0.5 µm or more. Because of the use of an acid solution, the metal such as aluminum is dissolved during anodization and the resulted anodic oxidation film becomes porous. Also, because of the porous structure, the resistance of the oxide film is very low so that the thickness thereof can be increased with a relatively low voltage. The same applies to the use of an alkaline solution when the metal is amphoteric.

Figure 1C:
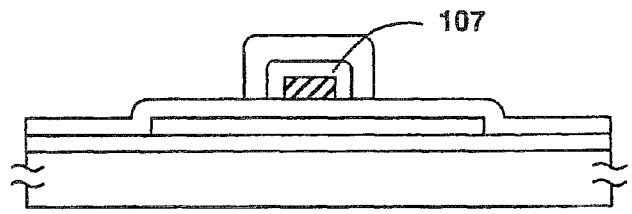
Figure 1D:
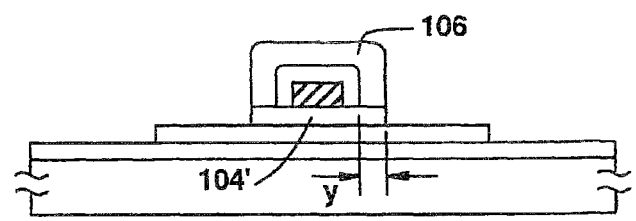

Referring to FIG. 1D, the insulating film 104 is etched by dry etching or wet etching with the anodic oxide film 106 used as a mask. The etching may be continued until the surface of the active layer is exposed or may be stopped before the surface of the active layer is exposed. However, it is preferable to continue the etching until the surface of the active layer is exposed in view of a productivity, production yield, and uniformity. The portion of the insulating film 104 under the gate electrode 105 and the anodic oxide film 106 remains as a gate insulating film 104'. When using aluminum, tantalum or titanium as a main component of the gate electrode while the gate insulating film 104 comprises silicon oxide, it is possible to use a fluorine containing etchant such as $NF_3$ and $SF_6$ for a dry etching. In this case, the insulating film 104 is etched quickly while the etching rate of aluminum oxide, tantalum oxide and titanium oxide is enough small so that the selective etching of the insulating film 104 can be done.

Also, in the case of using a wet etching, it is possible to use a hydrofluoric acid containing etchant such as a 1/100 hydrofluoric acid. In this case, the silicon oxide insulating film 104 can also be selectively etched because the etching rate of the oxide of the aluminum, tantalum, and titanium is enough small.

After etching the insulating film 104, the anodic oxide film 106 is removed. As an etchant, a solution containing phosphoric acid may be used. For example, a mixed acid of a phosphoric acid, an acetic acid, and a nitric acid is desirable.

However, when using aluminum as a gate electrode, the gate electrode is also etched by the etchant. In accordance with the present invention, this problem is solved by the provision of a barrier type anodic oxide film 107 between the gate electrode and the anodic oxide 106 as shown in FIG. 1C.

The anodic oxide film 107 can be formed by applying an electric current to the gate electrode after the formation of the anodic oxide 106 in an ethylene glycol solution containing a tartaric acid, boric acid, or nitric acid at 3-10%. The thickness of the anodic oxide 107 may be decided depending upon the magnitude of the voltage between the gate electrode and a counter electrode. It should be noted that the electrolyte used in this anodic oxidation is relatively neutral so that the density of the anodic oxide can be increased contrary to the use of an acid solution. Thus, a barrier type anodic oxide can be formed. The etching rate of the porous type anodic oxide is 10 times higher than that of the barrier type anodic oxide.

Accordingly, the porous anodic oxide 106 can be removed by the phosphoric acid containing etchant without damaging the gate electrode.

Since the gate insulating film 104' is formed in a self-aligning manner with respect to the porous anodic oxide 106, the outer edge of the gate insulating film 104' is distant from the outer edge of the barrier type anodic oxide 107 by the distance "y" as shown in FIG. 1D. One of the advantages of the use of an anodic oxide is that this distance "y" can be decided by the thickness of the anodic oxide in a self-aligning manner.

Figure 1E:
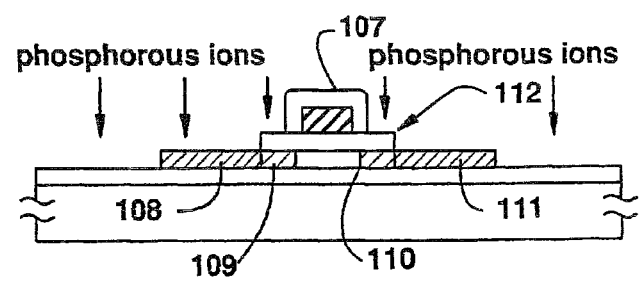

Referring to FIG. 1E, an N-type or P-type impurity ions are accelerated into the active layer 103 to form high impurity concentration regions 108 and 111 in the portion on which the gate insulating film 104' has been removed (or thinned) and to form low impurity concentration regions 109 and 110 on which the gate insulating film remains. The concentration of the impurity ions in the regions 109 and 110 is relatively small than that in the regions 108 and 111 because the impurity ions are introduced through the gate insulating film 104' into the regions 109 and 110. Also, the electrical resistance of the impurity regions 108 and 111 is lower than that of the impurity regions 109 and 110 because of the higher concentration of the added impurity. The difference in the concentration of impurity ions depends upon the thickness of the gate insulating film 104'. Normally, the concentration in the regions 109 and 110 is smaller than that in the regions 108 and 111 by 0.5 to 3 digits.

Figure 1F:
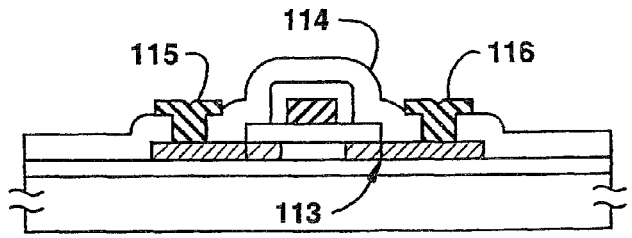

The portion of the active layer just below the gate electrode is not doped with the impurity and can be maintained intrinsic or substantially intrinsic. Thus, a channel region is defined. After the impurity introduction, the impurity is activated by irradiating the impurity regions with a laser or a light having a strength equivalent to the laser light. This step can be finished at one step. As a result, the edge 112 of the gate insulating film 104' is approximately aligned with the edge 113 of the high resistance region (HRD) 110 as shown in FIGS. 1E and 1F.

As explained above, the high resistivity regions 109 and 110 can be determined in a self-aligning manner by the thickness "y" of the anodic oxide film 106 which in turn is decided by the amount of the electric current supplied to the gate electrode during the anodic oxidation step. This is much superior to the use of an insulating material adjacent to the gate electrode as shown in FIGS. 6A-6F.

Also, the foregoing method is advantageous because the low resistivity regions and the high resistivity regions can be formed with a single impurity doping step. Also, in the prior art, there is a problem that the HRD is difficult to contact with an electrode in an ohmic contact because of its high resistivity and a drain voltage is undesirably lowered because of this resistivity while the HRD has an advantage that it is possible to avoid the occurrence of hot carriers and to increase the reliability of the device. The present invention solves these incomprehensive problems at one time and makes it possible to form the HRD having a width of 0.1 to 1 μm in a self-aligning manner and enables an ohmic contact between the electrodes and the source and drain regions.

Also, the locational relation of the boundary between the channel region and the HRD (109 or 110) with respect to the gate electrode can be controlled by changing the thickness of the barrier type anodic oxide 107 as explained below with reference to FIGS. 4A-4D. For example, when using an ion doping method (also called as plasma doping) ions are introduced without being mass separated so that an approach angle of the ions is not uniform. Therefore, the ions introduced into the active layer tend to spread in a lateral direction.

Figure 4A:
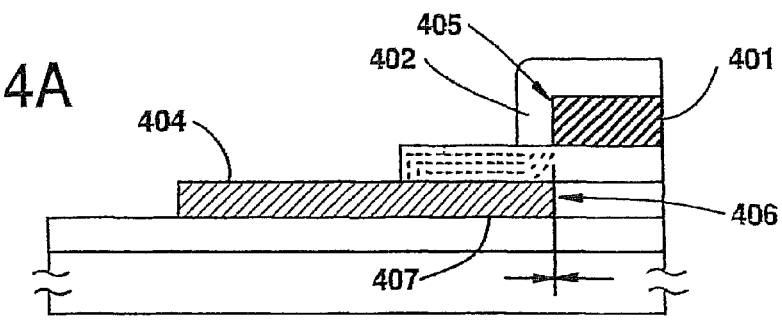
FIGS. 4A-4D are enlarged views of a part of a TFT in accordance with the present invention.

FIG. 4A shows a partial enlarged view of the TFT shown in FIG. 1E. The reference numeral 401 shows a gate electrode. The reference numeral 402 shows a barrier type anodic oxide which corresponds to the barrier type anodic oxide 107 of FIG. 1E. The reference numeral 404 shows an active layer. The thickness of the active layer is about 800 Å for example. When the thickness of the anodic oxide 402 is approximately the same as the thickness of the active layer 404, the edge 405 of the gate electrode is substantially aligned with the edge 406 of the HRD 407.

Figure 4B:
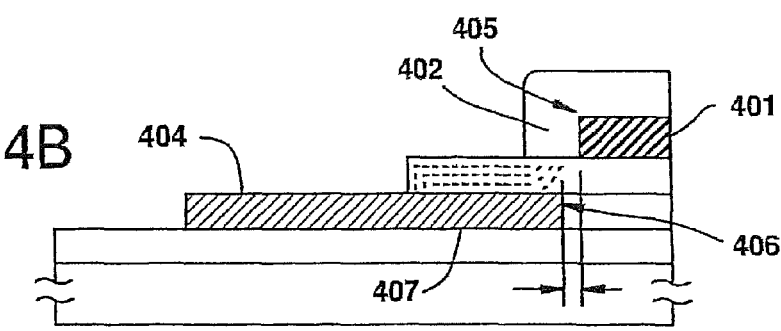
Figure 4C:
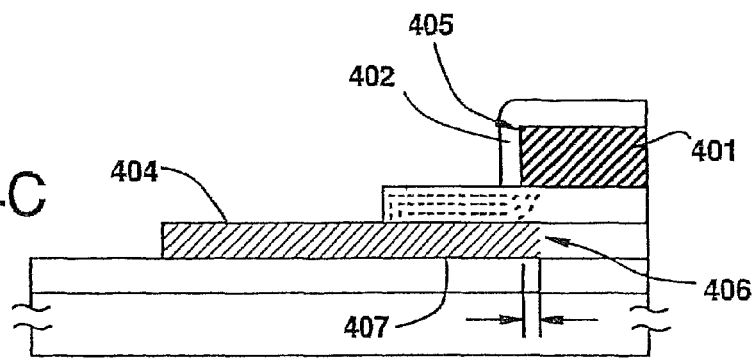
Figure 4D:
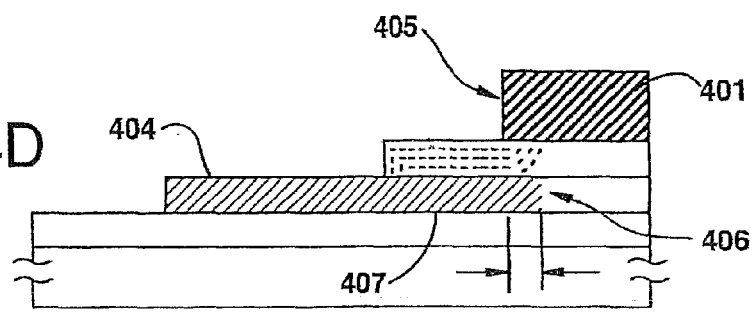

When the anodic oxide layer 402 is thicker than the active layer, for example, 3000 Å, the edge 405 of the gate electrode is offset from the edge 406 of the HRD as shown in FIG. 4B. On the other hand, when the anodic oxide 402 is relatively thin as compared with the active layer, the gate electrode overlaps the HRD as shown in FIG. 4C. The degree of this overlapping becomes maximum when there is no anodic oxide around the gate electrode 401 as shown in FIG. 4D.

In general, the offset structure reduces a reverse direction leak current (off current) and increases the ON/OFF ratio. The offset structure is suitable for TFTs used for driving pixels of a liquid crystal device in which the leak current should be avoided as much as possible. However, there is a tendency that the anodic oxide degrades due to hot electrons occurring at the edge of the HRD and trapped by the oxide.

When the gate electrode overlaps the HRD, the above disadvantage of the degradation can be reduced and an ON current is increased. However, there is a disadvantage that a leak current increases. For this reason, the overlapping structure is suitable for TFTs provided in a peripheral circuit of a monolithic active matrix device. Accordingly, an appropriate configuration may be selected from FIGS. 4A through 4E depending upon the utilization thereof.

EXAMPLE 1

Referring again to FIGS. 1A-1F, a process of manufacturing a TFT will be discussed in more detail. A Corning 7059 glass substrate having a dimension 300 mm×400 mm or 100 mm×100 mm is used as the substrate 101. A silicon oxide film having a thickness of 100-300 nm is formed on the substrate as the base film 102 through sputtering in an oxygen gas, for example. However, it is possible to use a plasma CVD using TEOS as a starting material in order to improve the productivity.

A crystalline silicon film 103 in the form of an island is formed by depositing an amorphous silicon to a thickness of 300-5000 Å, preferably, 500-1000 Å through plasma CVD or LPCVD, then crystallizing it by heating at 550-600° C. for 24 hours in a reducing atmosphere and then patterning it. Instead of a heat annealing, a laser annealing may be employed. Further, a silicon oxide film 104 is formed thereon by sputtering to a thickness of 70-150 nm.

Then, an aluminum film containing 1 weight % Si or 0.1-0.3 weight % Sc (scandium) is formed to a thickness of 1000 Å to 3 μm by electron beam evaporation or sputtering. A gate electrode 105 is formed by patterning the aluminum film as shown in FIG. 1A.

Further, referring to FIG. 1B, the gate electrode 105 is anodic oxidized by applying a current thereto in an electrolyte to form an anodic oxide film 106 having a thickness of 3000-6000 Å, for example 5000 Å. As the electrolyte, an acid aqueous solution of citric acid, oxalic acid, phosphoric acid, chromic acid, or sulfuric acid at 3-20% is used. The applied voltage is 10-30 V while the applied current is kept constant. In this example, an oxalic acid is used. The temperature of the electrolyte is 30° C. A voltage of 10 V is applied for 20-40 minutes. The thickness of the anodic oxide film is controlled depending upon the time for the anodic oxidation.

Subsequently, the gate electrode is subjected to a further anodic oxidation in another electrolyte comprising an ethylene glycol solution containing tartaric acid, boric acid or nitric acid at 3-10% to form a barrier type anodic oxide film 107 around the gate electrode. The temperature of the electrolyte is kept preferably lower than a room temperature, for example, 10° C., in order to improve the quality of the oxide film. The thickness of the anodic oxide film 107 is in proportion to the magnitude of the applied voltage. The applied voltage is selected from a range of 80-150 V. When the applied voltage is 150 V, the thickness becomes 2000 Å. The thickness of the anodic oxide film 107 is determined in accordance with a required configuration of the TFT as discussed with reference to FIGS. 4A-4D, however, it would be necessary to raise the voltage to 250 V or higher to obtain an anodic oxide film having a thickness of 3000 Å or more. Since there is a danger that the TFT is damaged by such a large voltage, it is preferable to select the thickness of the anodic oxide 107 as 3000 Å or less.

Referring to FIG. 1D, the silicon oxide film 104 is partly removed by dry etching. This etching may be either in a plasma mode of an isotropic etching or in a reactive ion etching mode of an anisotropic etching. However, the selection ratio of the silicon and the silicon oxide should be sufficiently large so that the active silicon layer should not be etched so much. Also, the anodic oxides 106 and 107 are not etched by $CF_4$ while the silicon oxide film 104 is selectively etched. Since the portion of the silicon oxide film 104 below the porous anodic oxide 106 is not etched, a gate insulating film 104' remains without being etched.

Then, referring to FIG. 1E, only the porous anodic oxide film 106 is etched by using a mixed acid of phosphoric acid, acetic acid or nitric acid at an etching rate, for example, 600 Å/minute. The gate insulating film 104' remains.

After removing the porous anodic oxide film 106, an impurity element for giving the semiconductor layer one conductivity type is added by ion doping method with the gate electrode and the barrier type anodic oxide film 107 and the gate insulating film 104' used as a mask in a self-aligning manner. As a result, high resistivity impurity regions 109 and 110 and low resistivity impurity regions (source and drain regions) 108 and 111 are formed. In the case of forming p-type regions, diborane ($B_2H_6$) is used as a dopant gas. The dose amount is $5\times10^{14}$ to $5\times10^{15}$ atoms/$cm^2$. The accelerating energy is 10-30 kV. After the introduction, the added impurity is activated by using a KrF excimer laser (wavelength 248 nm, pulse width 20 nsec).

When measuring the concentration of the impurity in the active layer by SIMS (secondary ion mass spectrometry), the impurity concentration in the source and drain regions 108 and 111 is $1\times10^{20}$ to $2\times10^{21}$ atoms/$cm^3$ and the impurity concentration in the high resistivity regions 109 and 110 is $1\times10^{17}$ to $2\times10^{18}$ atoms/$cm^3$. This corresponds to a dose of $5\times10^{14}$-$5\times10^{15}$ atoms/$cm^2$ in the former case and $2\times10^{13}$ to $5\times10^{14}$ atoms/$cm^2$ in the latter case. This difference is caused by the existence of the gate insulating film 104'. Generally, the concentration is 0.5-3 times higher in the low resistivity impurity regions than in the high resistivity regions.

Then, an interlayer insulating film 114 of silicon oxide is formed on the entire structure by a CVD at 3000 Å thick, following which contact holes are formed through the insulating film and aluminum electrodes formed therein to contact the source and drain regions as shown in FIG. 1F. Finally, a hydrogen annealing is performed to complete the formation of the TFT.

Figure 5A:
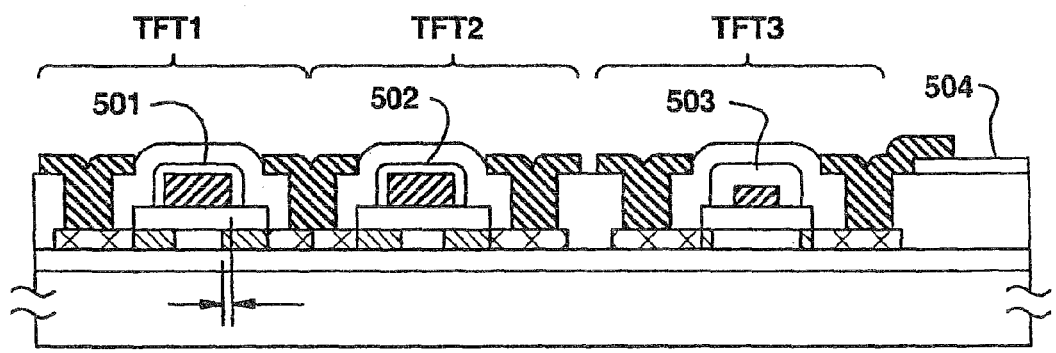
FIGS. 5A and 5B show a circuit substrate for an active matrix device which employs the TFTs in accordance with the present invention.

An example of an application of the TFT of the present invention to a circuit substrate for an active matrix device such as a liquid crystal device will be explained with reference to FIG. 5A. In FIG. 5A, three TFTs are formed on a substrate. The TFT 1 and TFT 2 are used as driver TFTs in a peripheral circuit. The barrier type anodic oxide 501 and 502 in the TFT 1 and TFT 2 are 200-1000 Å thick, for example, 500 Å. Therefore, the gate electrode overlaps the high resistivity regions. The drain of TFT 1 and the source of TFT 2 are connected to each other, the source of TFT 1 is grounded, and the drain of TFT 2 is connected to a power source. Thus, a CMOS inverter is formed. It should not be limited to this configuration but any other circuits may be formed.

On the other hand, the TFT 3 is used as a pixel TFT for driving a pixel. The anodic oxide 503 is as thick as 2000 Å so that an offset area is formed. This configuration corresponds to the structure shown in FIG. 4B. Accordingly, a leak current is reduced. One of the source and drain of the TFT 3 is connected to a pixel electrode 504 made of indium tin oxide (ITO). In the meantime, the TFTs 1 and 3 are N-channel type TFTs while the TFT 2 is a p-channel type TFT.

EXAMPLE 2

Figure 2A:
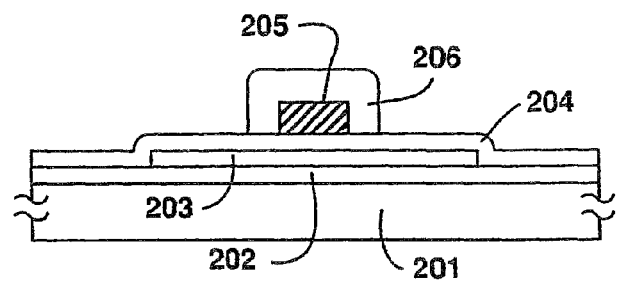
FIGS. 2A-2F are cross sectional views showing a manufacturing method of a TFT in accordance with the Example 2 of the invention.

This example is an improvement of the Example 1, in which source and drain regions are provided with a silicide layer. Referring to FIG. 2A, the reference numeral 201 shows a Corning 7059 glass substrate, 202: a base film, 203: a silicon island, 204: an insulating film, 205: an Al gate electrode (200 nm-1 μm thick), and 206: a porous anodic oxide film (3000 Å-1 μm, e.g. 5000 Å thick). The same process as explained in the Example 1 is used to form these elements and the redundant explanation is omitted.

Figure 2B:
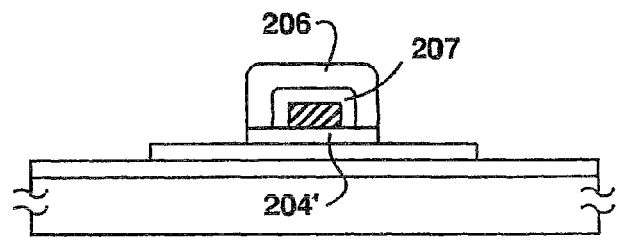

Referring to FIG. 2B, a barrier type anodic oxide film 207 of 1000-2500 Å thick is formed in the same manner as in the Example 1 after the formation of the porous anodic oxide 206. Then, a gate insulating film 204' is formed by etching the insulating film 204 with the porous anodic oxide 206 used as a mask in a self-aligning manner.

Figure 2C:
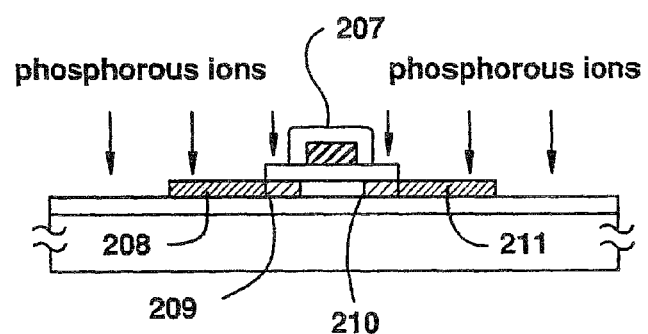

Then, the porous anodic oxide 206 is removed by etching using the barrier type anodic oxide 207 as a mask. Further, ion doping of an impurity element (phosphorous) is carried out using the gate electrode 205 and the anodic oxide 207 as a mask in a self-aligning manner so that low resistivity impurity regions 208 and 211 and high resistivity impurity regions 209 and 210 are formed as shown in FIG. 2C. The dose amount is $1\times10^{14}$-$5\times10^{14}$ atoms/$cm^2$ and the acceleration voltage is 30-90 kV.

Figure 2D:
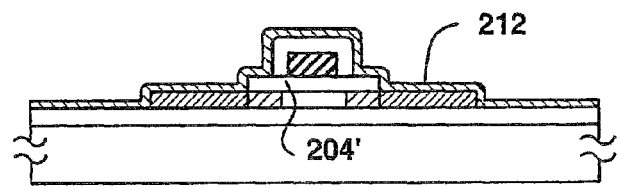

Referring to FIG. 2D, a metal film 212 such as titanium is formed on the entire surface by sputtering. The thickness of the metal is 50-500 Å. The low resistivity regions 208 and 211 directly contacts the metal film. In place of titanium, other metals, for example, nickel, molybdenum, tungsten, platinum or paradium may be used.

Subsequently, a KrF excimer laser (248 nm wavelength, 20 nsec pulse width) is irradiated onto the surface in order to activate the added impurity and form metal silicide regions 213 and 214 by reacting the metal film and the silicon in the active layer. The energy density of the laser beam is 200-400 mJ/cm$^2$, preferably, 250-300 mJ/cm$^2$. Also, it is desirable to maintain the substrate at 200-500° C. during the laser irradiation in order to avoid a peeling of the titanium film.

It is, of course, possible to use other light sources other than excimer laser. However, a pulsed laser beam is more preferable than a CW laser because an irradiation time is longer and there is a danger that the irradiated film is thermally expanded and peels off in the case of a CW laser.

As to examples of pulsed laser, there are a laser of an IR light such as Nd:YAG laser (Q switch pulse oscillation is preferred), a second harmonic wave of the Nd:YAG (visible light), and a laser of a UV light such as excimer laser of KrF, XeCl and ArF. When the laser beam is emitted from the upper side of the metal film, it is necessary to select wavelengths of the laser in order not to be reflected on the metal film. However, there is no problem when the metal film is enough thin. Also, it is possible to emit the laser from the substrate side. In this case, it is necessary to select a laser which can transmit through the silicon.

Also, instead of the laser annealing, a lump annealing of visible light or near infrared light may be employed. In such a case, the annealing is performed in order to heat the surface to 600-1000° C., for example, for several minutes at 600° C. or several tens seconds at 1000° C. An annealing with a near infrared ray (e.g. 1.2 µm) does not heat the glass substrate so much because the near infrared ray is selectively absorbed by silicon semiconductors. Further, by shortening the irradiation time, it is possible to prevent the glass from being heated.

Figure 2E:
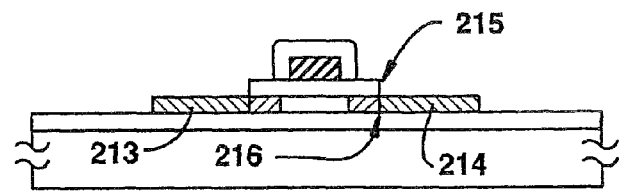

Thereafter, referring to FIG. 2E, only the titanium film remaining without converting into a silicide, for example, on the gate electrode or gate insulating film, is etched off by using an etchant containing hydrogen peroxide, ammonium and water at 5:2:2. As a result, titanium silicide 213 and 214 remain.

Figure 2F:
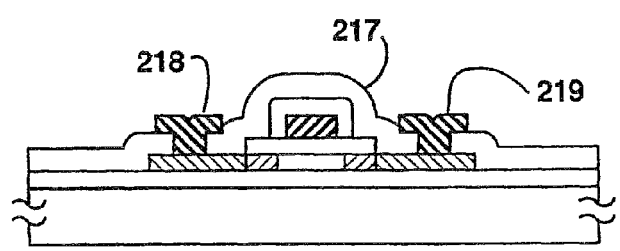

Referring to FIG. 2F, an interlayer insulating film 217 is formed on the whole surface by depositing silicon oxide at 2000 Å-1 µm, for example, 3000 Å through CVD. Contact holes are formed through the insulating film 217 on the source and drain regions 213 and 214, following which aluminum electrodes or wirings 218 and 219 having a thickness of 2000 Å-1 µm, e.g. 5000 Å are formed therein. The use of the metal silicide provides a stable interface with the aluminum as compared with the use of silicon semiconductors and provides a good contact with the aluminum electrode. The contact can be further improved by forming a barrier metal, for example, titanium nitride, between the aluminum electrodes 218 and 219 and the metal silicide regions 213 and 214. The sheet resistance of the silicide regions can be made 10-50Ω/square while that of the HRD 209 and 210 is 10-100 kΩ/square.

By the foregoing process, it is possible to improve the frequency characteristic of the TFT and suppress the hot carrier damage even with a higher drain voltage.

In this example, the low resistivity impurity region and the metal silicide region approximately coincide with each other. In particular, the edge 215 of the gate insulating film 204' is approximately coextensive with the boundary 216 between the high resistivity impurity region 210 and the low resistivity impurity region 211 and also with the inner edge of the metal silicide region 214. Thus, obviously, the explanations with reference to FIGS. 4A-4D can be applied to this example by replacing the low resistivity region with the metal silicide region.

Figure 5B:
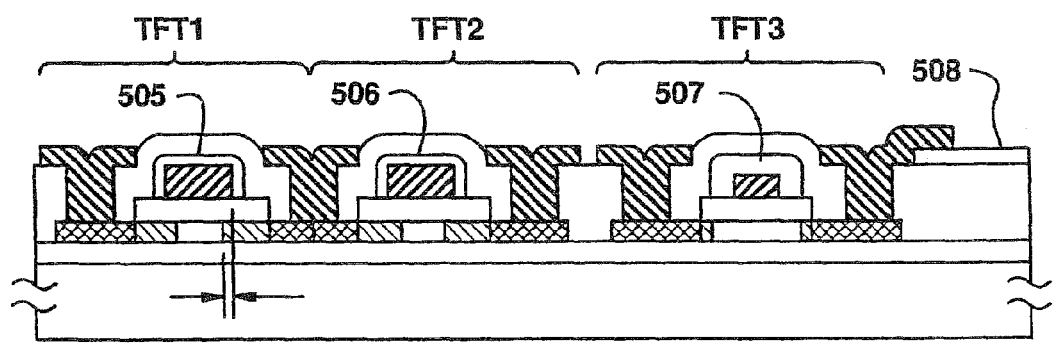
Figure 6A:
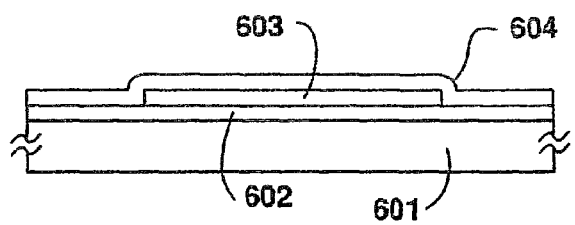
FIGS. 6A to 6F are cross sectional views showing a manufacturing method of a TFT in the prior art.
Figure 6B:
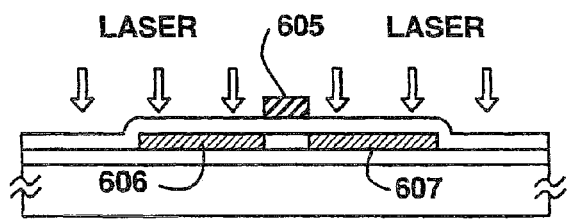
Figure 6C:
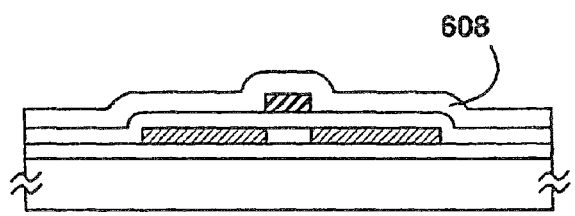
Figure 6D:
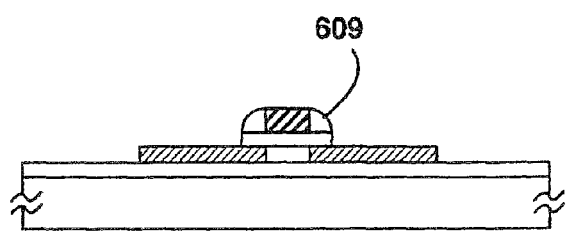
Figure 6E:
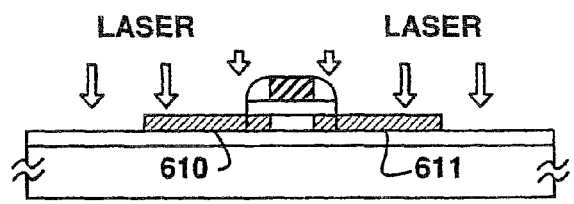
Figure 6F:
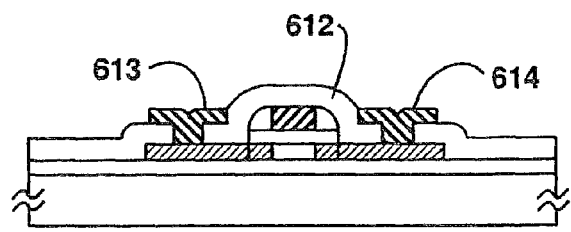

An application of this example to an active matrix device is shown in FIG. 5B. In FIG. 5B, three TFTs are formed on a substrate. The TFT 1 and TFT 2 are used as driver TFTs in a peripheral circuit. The barrier type anodic oxide 505 and 506 in the TFT 1 and TFT 2 are 200-1000 Å thick, for example, 500 Å. Therefore, the gate electrode overlaps the high resistivity regions. The drain of TFT 1 and the source of TFT 2 are connected to each other, the source of TFT 1 is grounded, and the drain of TFT 2 is connected to a power source. Thus, a CMOS inverter is formed. It should not be limited to this configuration but any other circuits may be formed.

On the other hand, the TFT 3 is used as a pixel TFT for driving a pixel. The anodic oxide 507 is as thick as 2000 Å so that an offset area is formed. This configuration corresponds to the structure shown in FIG. 4B. Accordingly, a leak current is reduced. One of the source and drain of the TFT 3 is connected to a pixel electrode 508 made of indium tin oxide (ITO). In order to control the thickness of the anodic oxide of each TFT independently, the gate electrode of each TFT may preferably be made independent from one another. In the meantime, the TFTs 1 and 3 are N-channel type TFTs while the TFT 2 is a p-channel type TFT.

Also, the formation of the titanium film may be done before the ion doping of the impurity. In this case, it is advantageous that the titanium film prevents the surface from being charged up during the ion doping. Also, it is possible to carry out an annealing with laser or the like after the ion doping step but before the titanium forming step. After the titanium forming step, the titanium silicide can be formed by light irradiation or heat annealing.

EXAMPLE 3

Figure 3A:
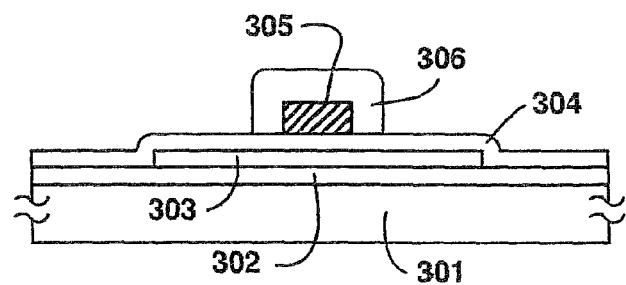
FIGS. 3A-3F are cross sectional views showing a manufacturing method of a TFT in accordance with the Example 3 of the invention.

This example is a further variation of Example 2, in which the order of the formation of a metal silicide and the ion doping is changed. Referring to FIG. 3A, on the Corning 7059 substrate 301 is formed a base oxide film 302, island-like crystalline semiconductor (e.g. silicon) region 303, silicon oxide film 304, aluminum gate electrode 305 of 2000 Å to 1 µm, and a porous anodic oxide film 306 of 6000 Å on the side of the gate electrode. These are formed in the same manner as in the Example 1 as discussed with reference to FIGS. 1A and 1B.

Figure 3B:
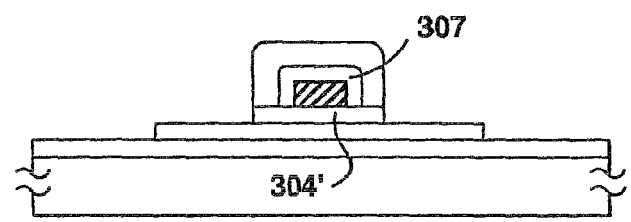

Further, a barrier type anodic oxide film 307 is formed to 1000-2500 Å in the same manner as in the Example 1. Subsequently, the silicon oxide film 304 is patterned into a gate insulating film 304' in a self-aligning manner as shown in FIG. 3B.

Figure 3C:
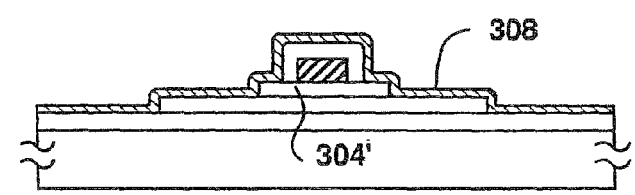

Referring to FIG. 3C, the porous anodic oxide 306 is removed in order to expose a part of the gate insulating film 304'. Subsequently, a metal layer such as titanium film 308 is formed on the entire surface by sputtering to a thickness of 50-500 Å.

Then, a KrF excimer laser is irradiated in order to form titanium silicide regions 309 and 310. The energy density of the laser is 200-400 mJ/cm$^2$, preferably, 250-300 mJ/cm$^2$. Also, it is desirable to maintain the substrate at 200-500° C. in order to prevent the titanium film from peeling during the laser irradiation. This step may be carried out with lump annealing of a visible light or far infrared light.

Figure 3D:
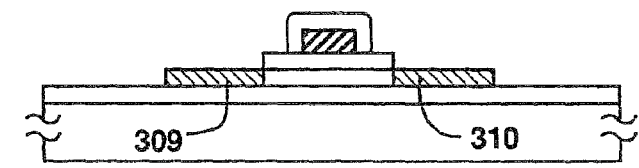

Referring to FIG. 3D, only the titanium film remaining, for example, on the gate electrode or gate insulating film, is etched off by using an etchant containing hydrogen peroxide, ammonium and water at 5:2:2. As a result, titanium silicide 309 and 310 remain.

Figure 3E:
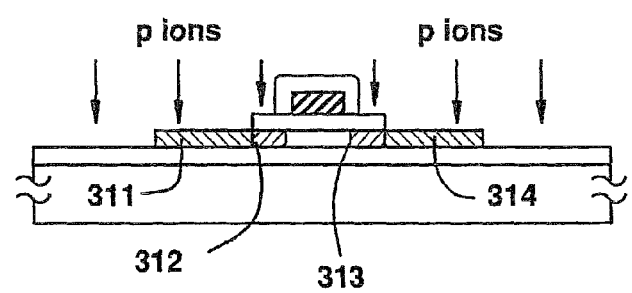

Referring to FIG. 3E, an ion doping of phosphorous is then performed using the gate electrode 305, the anodic oxide 307 and the gate insulating film 304' as a mask in order to form low resistivity impurity regions 311 and 314 and high resistivity impurity regions 312 and 313 at a dose of 1-5 ×10$^{14}$ atoms/cm$^2$ and an acceleration voltage 30-90 kV. The titanium silicide regions 309 and 310 approximately coincide with the low resistivity regions 311 and 314, which in turn are source and drain regions.

Figure 3F:
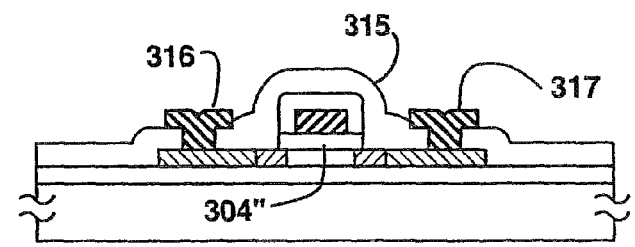

Then, again, a KrF excimer laser (248 nm wavelength, 20 nsec pulse width) is irradiated in order to activate the added phosphorous. This may be carried out using a lump annealing of visible or far infrared ray as said above. Thereafter, the gate insulating film 304' is etched with the gate electrode and the anodic oxide 307 used as a mask to form a gate insulating film 304'' as shown in FIG. 3F. This is because the impurity added into the gate insulating film 304' makes the device property instable.

In FIG. 3F, an interlayer insulator 315 is formed on the entire surface by depositing silicon oxide at 6000 Å thick through CVD. Contact holes are opened through the insulator to form aluminum electrodes 316 and 317 on the source and drain regions. Thus, a TFT is completed.

In accordance with the present invention, the number of doping, or annealing steps can be reduced.

Moreover, an impurity such as carbon, oxygen or nitrogen may be added in addition to the p-type or n-type impurity ions in order to further reduce the reverse direction leak current and increase the dielectric strength. This is particularly advantageous when used for pixel TFTs in an active matrix circuit. In this case, the TFT 3 of FIGS. 5 A and 5B has its anodic oxide film made the same thickness as the TFT 1 and TFT 2.

EXAMPLE 4

A fourth example of the present invention will be explained with reference to FIGS. 7A-7F. This example is comparative with the Example 1 and the same reference numerals show the same elements. Basically, each step is almost the same as the former examples so that redundant explanations will be omitted.

Figure 7A:
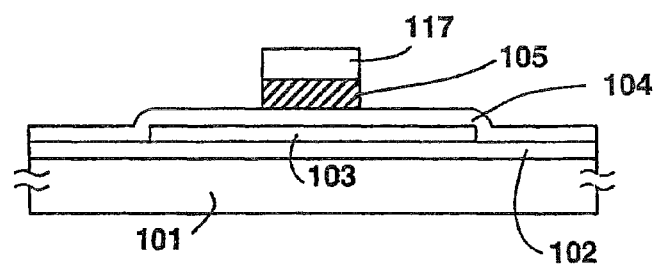
FIGS. 7A-7F are cross sectional views showing a manufacturing method of a TFT in accordance with the Example 4 of the invention.
Figure 7B:
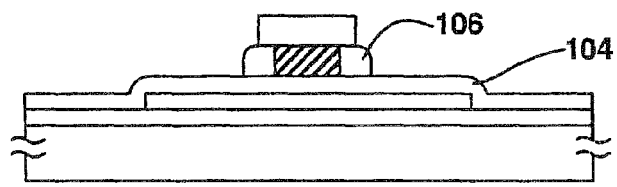

After forming a conductive film on the gate insulating film 104, a mask material such as photoresist, photosensitive polyimide or a polyimide is formed on the entire surface of the conductive film. For example, a photoresist (OFPR 800/30 cp manufactured by Tokyo Oka) is spin coated. It is desirable to form an anodic oxide film between the conductive film and the photoresist. (not shown in the figure) Then, these films are patterned into the gate electrode 105 and a mask 117 as shown in FIG. 7A. Then, in the same manner as in the Example 1, the porous anodic oxide film 106 is formed on the surface of the gate electrode 105 except for the portion on which the mask 117 is formed as shown in FIG. 7B.

Figure 7C:
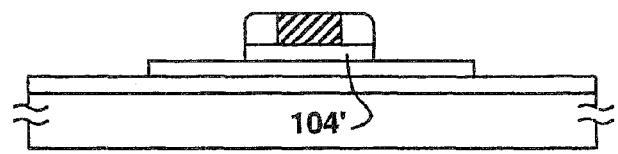

Then, referring to FIG. 7C, the silicon oxide film 104 is patterned by dry etching in order to expose a part of the silicon film 103 to thus form the gate insulating film 104'. The same etching method as is done in the Example 1 is also employed. Further, the photoresist mask is removed by conventional photolithography technique either before or after this etching step.

Figure 7D:
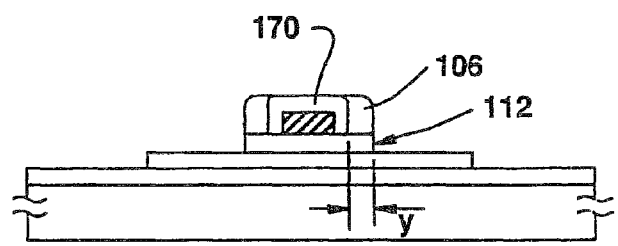
Figure 7E:
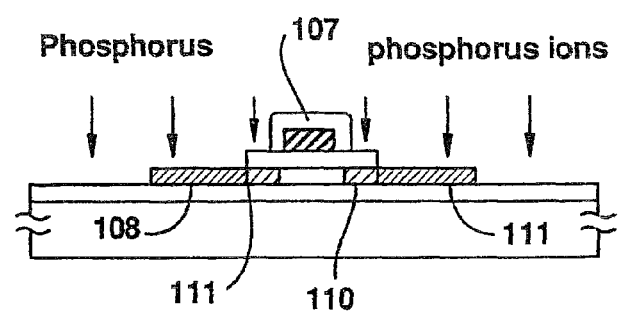
Figure 7F:
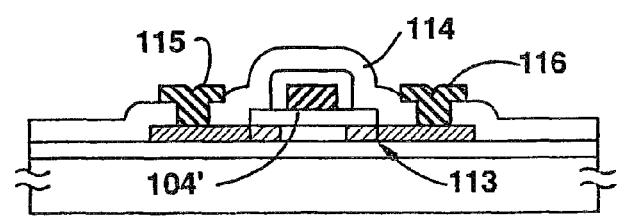

Referring to FIG. 7D, the barrier type anodic oxide film 107 is formed in the same manner as in the Example 1 to a thickness of 2000 Å. Using this barrier type anodic oxide film as a mask, the porous anodic oxide is removed by phosphoric acid etchant as explained before. Accordingly, the structure shown in FIG. 7E is obtained. The subsequent steps are identical to those explained with reference to FIGS. 1E and 1F.

Because the upper surface of the gate electrode is not oxidized in the first anodic oxidation, it is possible to prevent the thickness of the gate electrode from reducing too much during the first anodic oxidation. That is, in the Example 1, since the entire surface of the gate electrode is subjected to the anodic oxidation, the thickness of the gate electrode is reduced, causing the undesirable increase in the wiring resistance. This example avoids such a problem.

EXAMPLE 5

Figure 8A:
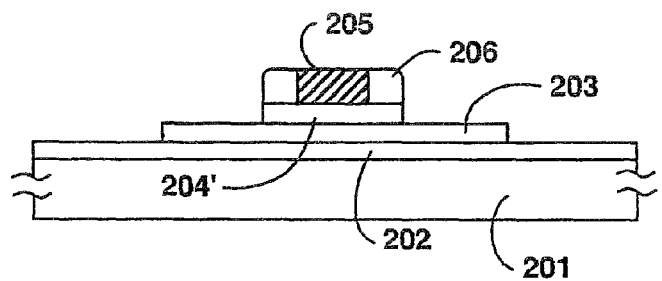
FIGS. 8A-8F are cross sectional views showing a manufacturing method of a TFT in accordance with the Example 5 of the invention.
Figure 8B:
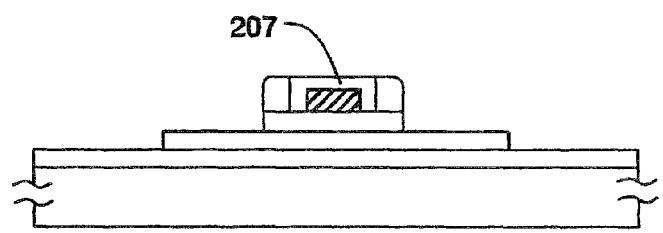
Figure 8C:
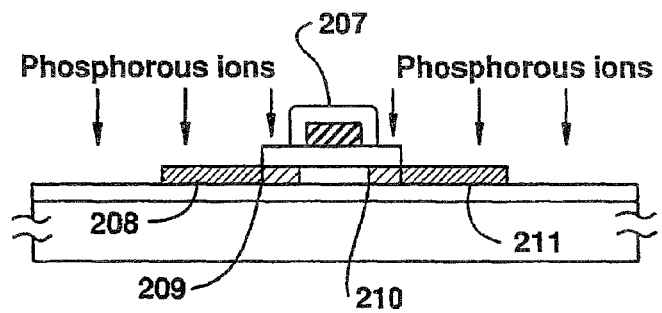
Figure 8D:
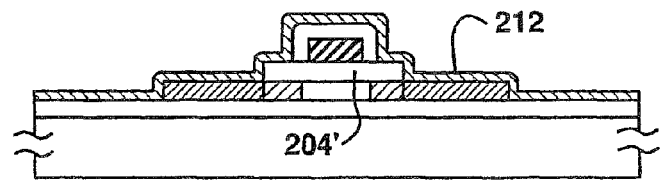
Figure 8E:
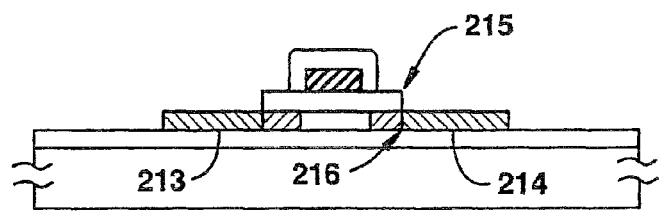
Figure 8F:
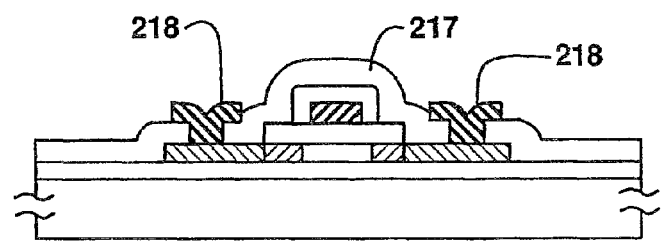

This example is a combination of the Example 2 and Example 4 and shown in FIGS. 8A-8F. The steps shown in FIGS. 8A-8B are exactly the same as the steps described with reference to FIGS. 7A-7C of the Example 4. Namely, the porous anodic oxide is formed on only the side surface of the gate electrode while the upper portion of the gate electrode is covered with a mask. Also, the steps occurring after exposing the part of the silicon layer 203 as shown in FIG. 8B, that is, the steps shown in FIGS. 8C-8F, are identical to those explained in the Example 2 with reference to FIGS. 2C-2F.

EXAMPLE 6

Figure 9A:
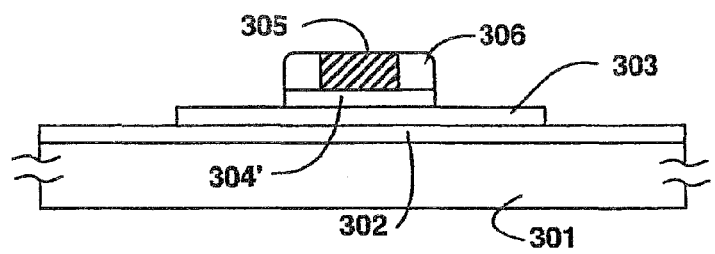
FIGS. 9A-9F are cross sectional views showing a manufacturing method of a TFT in accordance with the Example 6 of the invention.
Figure 9B:
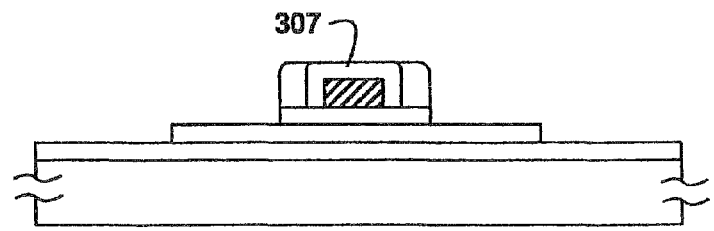
Figure 9C:
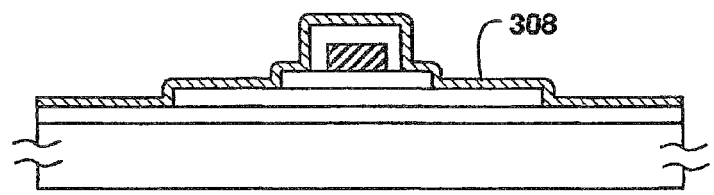
Figure 9D:
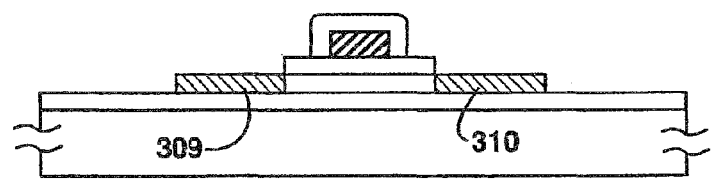
Figure 9E:
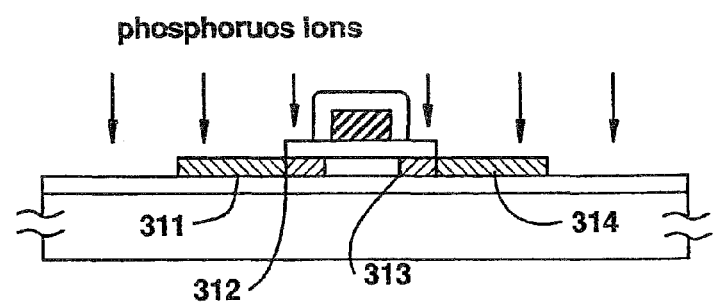
Figure 9F:
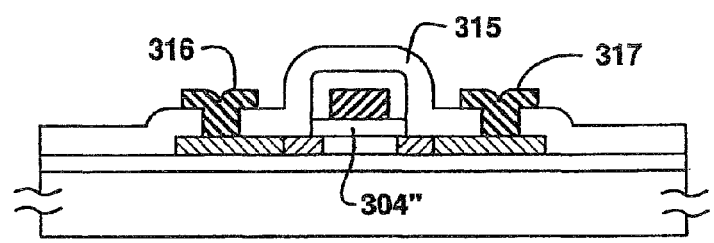
Figure 10A:
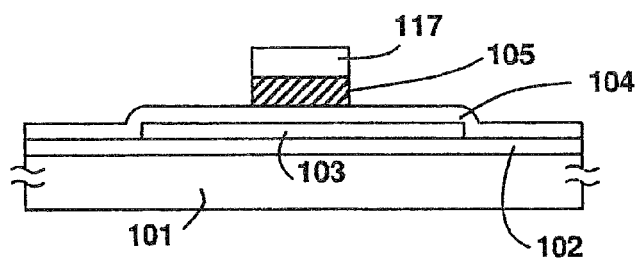
FIGS. 10A-10F are cross sectional views showing a manufacturing method of a TFT in accordance with the Example 7 of the invention.
Figure 10B:
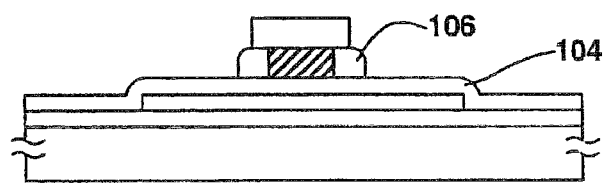
Figure 10C:
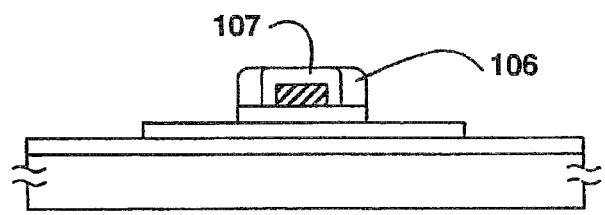
Figure 10D:
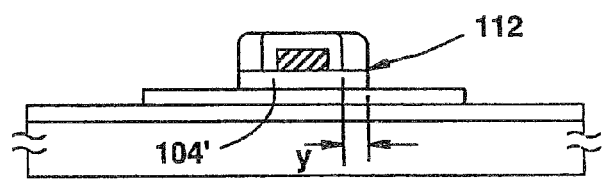
Figure 10E:
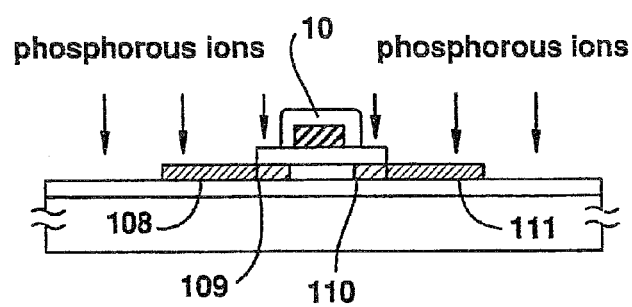
Figure 10F:
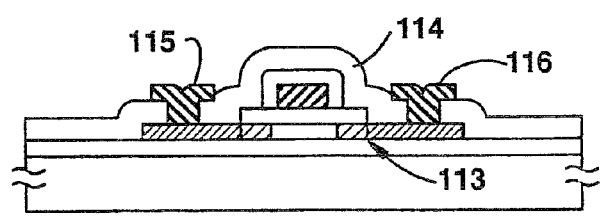

This example is also directed to a combination of the Example 3 and Example 5 and shown in FIGS. 9A-9F. Namely, this example is different from the Example 5 only in the order of the formation of the metal silicide regions and the ion introducing step. Accordingly, the steps shown in FIGS. 9A-9B are exactly the same as the steps described with reference to FIGS. 7A-7C of the Example 4, which in turn corresponds to the steps shown in FIGS. 8A and 8B of the Example 5. The subsequent steps shown in FIGS. 9C-9F exactly correspond to the steps shown in FIGS. 3C-3F of the Example 3.

EXAMPLE 7

Referring to FIGS. 10A-10F, this example is comparable with the Example 4 and shown in FIGS. 7A-7F. The only difference is the order of the steps shown in FIGS. 10C and 10D. Namely, in FIG. 10C, the barrier type anodic oxide film 107 is formed before etching the insulating film 104. After the formation of the barrier type anodic oxide 107, the insulating film 104 is patterned into the gate insulating film 104'. On the other hand, in Example 4, the insulating film 104 is patterned before the barrier anodic oxide is formed as shown in FIG. 7C. Accordingly, in the Example 7, the barrier type anodic oxide protects the aluminum gate electrode 105 during the etching of the insulating film 104.

EXAMPLE 8

Figure 11A:
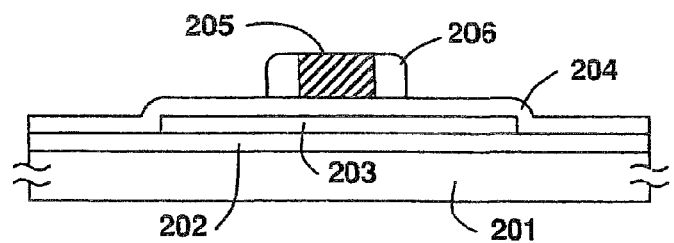
FIGS. 11A-11F are cross sectional views showing a manufacturing method of a TFT in accordance with the Example 8 of the invention.
Figure 11B:
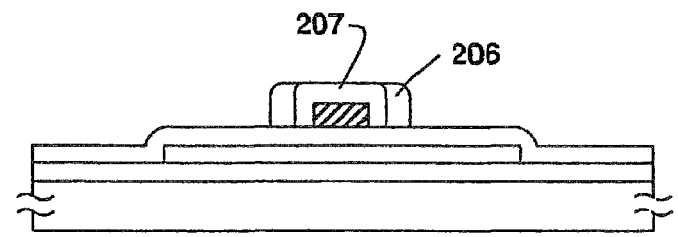
Figure 11C:
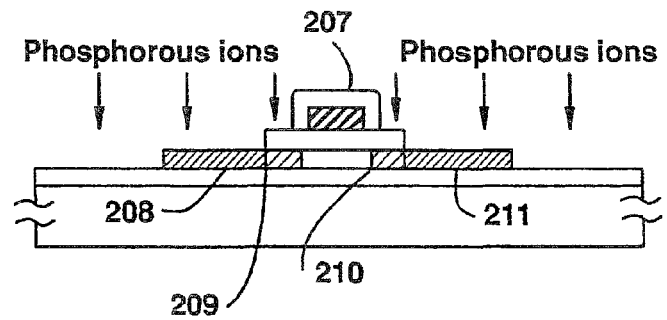
Figure 11D:
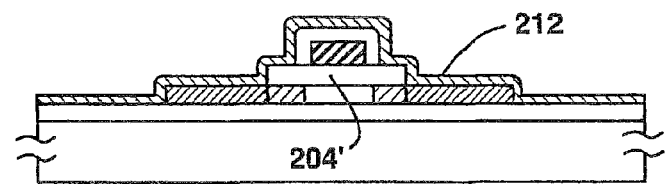
Figure 11E:
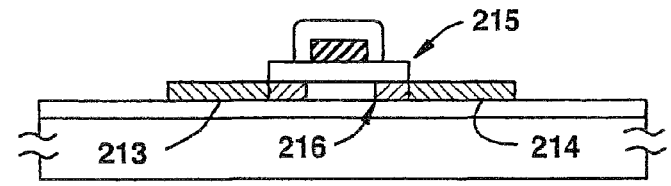
Figure 11F:
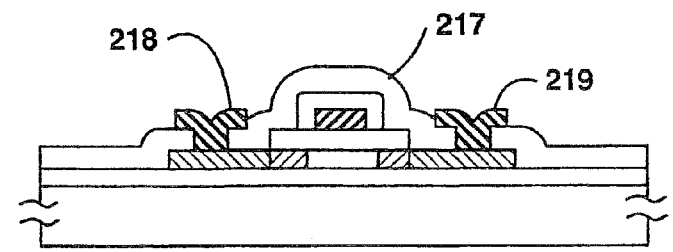

This example is entirely the same as the Example 5 of FIGS. 8A-8F except for the order between the step of patterning the gate insulating film and the step of forming the barrier type anodic oxide film 207. Namely, referring to FIGS. 11A-11B, the barrier type anodic oxide film 207 is formed before etching the part of the insulating film 204 as opposed to the Example 5. Thereafter, the insulating film is patterned into the gate insulating film 204'. The subsequent steps shown in FIGS. 11C-11F are entirely the same as those in the Example 5.

EXAMPLE 9

Figure 12A:
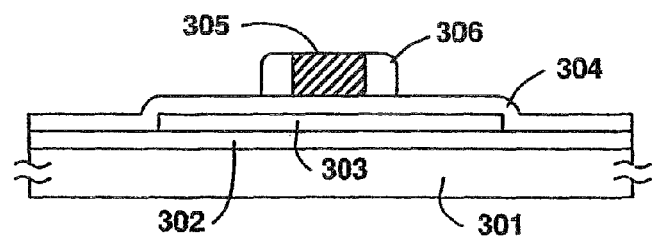
FIGS. 12A-12F are cross sectional views showing a manufacturing method of a TFT in accordance with the Example 9 of the invention.
Figure 12B:
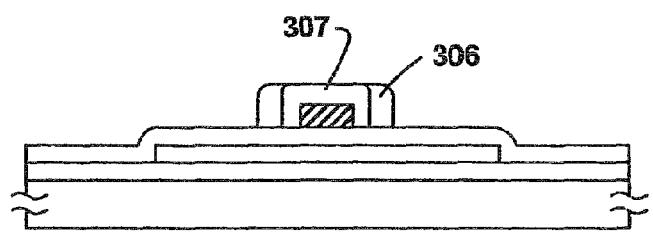
Figure 12C:
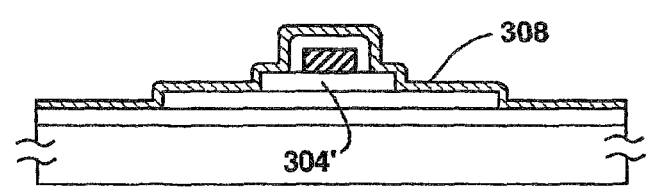
Figure 12D:
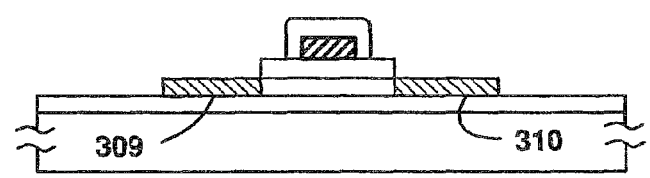
Figure 12E:
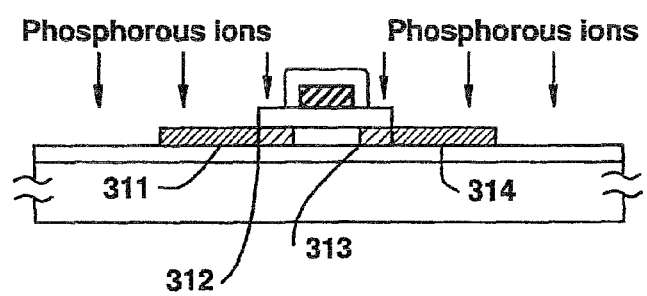
Figure 12F:
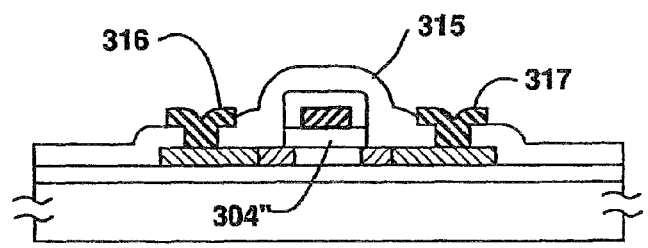

This example is also entirely the same as the Example 6 of FIGS. 9A-9F except for the order between the step of patterning the gate insulating film 304 and the step of forming the barrier type anodic oxide film 307. Namely, referring to FIGS. 12A-12B, the barrier type anodic oxide film 307 is formed before etching the part of the insulating film 304. Thereafter, the insulating film is patterned into the gate insulating film 304'. The subsequent steps shown in FIGS. 12C-12F are entirely the same as those in the Example 6.

Referring to Examples 6 to 9, although it has not been shown in the drawings, it is desirable to provide an anodic oxide film between the gate electrode and the mask when forming an anodic oxide film only on the side surface of the gate electrode. This feature will be described in more detail below with reference to FIGS. 13A-13D.

FIGS. 13A-13D show a fine wiring process using an anodizable material. On a substrate 701 which is for example, a silicon oxide film formed on a semiconductor, an aluminum film 702 is formed to a thickness of 2 μm, for example. Also, the aluminum may contain Sc (scandium) at 0.2 weight % to avoid an abnormal growth of the aluminum (hillock) during the subsequent anodizing step or may contain other additives such as yttrium (Y) to avoid an abnormal growth of the aluminum during a high temperature process.

Then, the aluminum film is anodic oxidized in an ethylene glycol solution containing 3% tartaric acid by applying a voltage of 10-30 V to the aluminum film. Thereby, a dense anodic oxide film 703 is formed on the aluminum film to a thickness of 200 Å. Then, using a photoresist mask 704, the aluminum film 702 and the oxide film 703 are patterned in accordance with a predetermined pattern. Since the oxide film is enough thin so that it is easily etched at the same time.

Figure 13A:
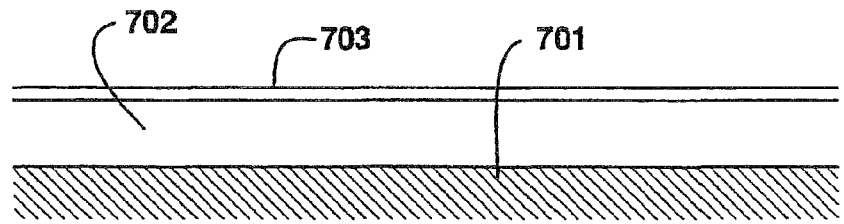
FIGS. 13A-13D are cross sectional views showing an anodic oxidation process in accordance with the present invention.
Figure 13B:
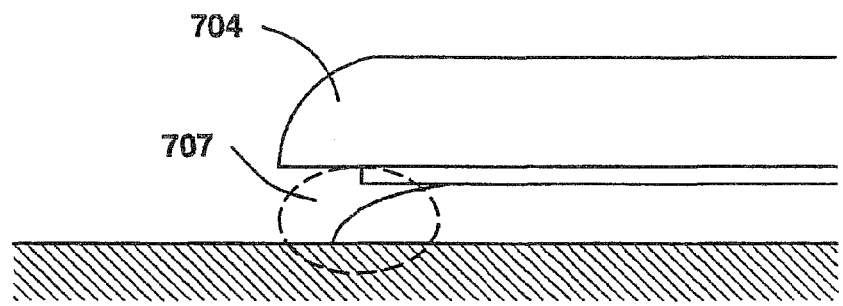
Figure 13C:
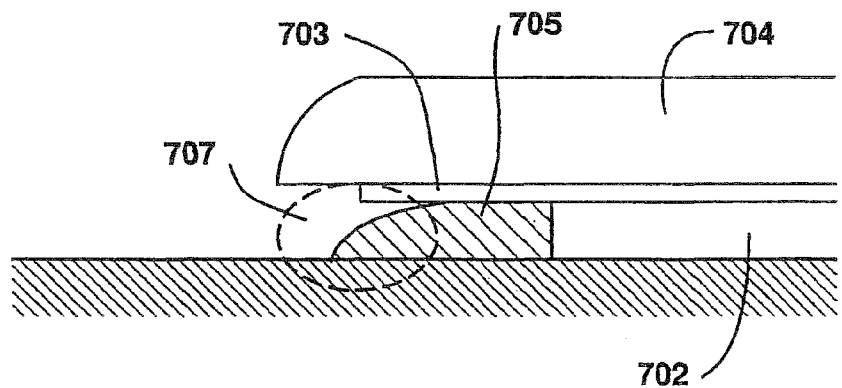

In the case of the above patterning is carried out by isotropic etching, the edge of the patterned aluminum film has a shape as shown by numeral 707 in FIG. 13B. Also, the difference in the etching rate between the oxide 703 and the aluminum 702 further enhances the configuration 17.

Then, a porous anodic oxide film 705 is formed by applying a voltage of 10-30 V in an aqueous solution containing 10% oxalic acid. The oxidation mainly proceeds into the inside of the aluminum film.

It has been confirmed that the top end of the oxide growth, i.e. the boundary between the anodic oxide and the aluminum becomes approximately perpendicular to the substrate surface. On the other hand, in the case of the barrier type anodic oxide, the shape of the barrier type anodic oxide is almost conformal to the shape of the starting metal.

In this example, the thickness of the aluminum film is 2 μm and the porous anodic oxide film 705 grows at 5000 Å. The top end of the growth is approximately vertical when observing it through an electron microphotography.

After the formation of the porous anodic oxide film, the resist mask 704 is removed with a conventional releasing agent. Since the mask anodic oxide 703 is very thin, it may be peeled off at the same time with the resist mask 704, or it may be removed in a later step by using a buffer hydrofluoric acid.

Figure 13D:
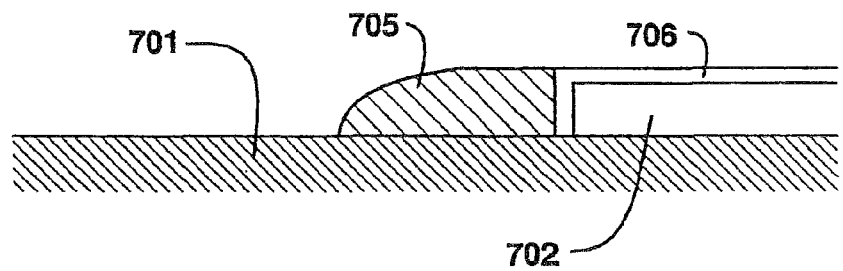

Further, as shown in FIG. 13D, a barrier type anodic oxide film 706 of 2000 Å thickness is further formed by performing another anodic oxidation in a different condition. That is, the electrolyte is an ethylene glycol solution containing 3% tartaric acid and the applied voltage is about 150 V. This oxide film uniformly grows surrounding the aluminum film 702 from the boundary between the porous anodic oxide 705 and the aluminum film 702 in an inside direction.

Accordingly, a structure is formed in which a barrier type anodic oxide film is formed surrounding the aluminum film and further a porous type anodic oxide film is formed on the side of the aluminum film.

The porous anodic oxide 705 can be easily and selectively removed by a phosphoric acid, $H_3PO_4$ without damaging the aluminum.

Needless to say, the foregoing process can be employed to the anodic oxidation process of the foregoing Examples 4 to 9.

While a glass substrate is used in the foregoing examples, the TFT of the present invention may be formed on any insulating surface, for example, an organic resin or an insulating surface formed on a single crystalline silicon. Also, it may be formed in a three dimensional integrated circuit device. In particular, the present invention is particularly advantageous when used in an electro-optical device such as a monolithic type active matrix circuit which has a peripheral circuit formed on a same substrate.

Also, while crystalline silicon is used in the examples, the present invention is applicable to an amorphous silicon or other kinds of semiconductors.

While this invention has been described with reference to the preferred embodiments, it is to be understood that various modifications thereof will be apparent to those skilled in the art and it is intended to cover all such modifications which fall within the scope of the appended claims.

What is claimed is:

1. A semiconductor device comprising:
   a substrate;
   a first insulating film over the substrate;
   a semiconductor film including silicon over the first insulating film, the semiconductor film comprising:
   a pair of metal silicide regions;
   a pair of impurity regions between the pair of metal silicide regions; and
   a channel region between the pair of impurity regions;
   a gate electrode over the channel region with a gate insulating film between the gate electrode and the channel region, the gate electrode partly overlapping each of the pair of impurity regions; and
   a second insulating film over the gate electrode,
   wherein portions of the pair of metal silicide regions are formed in end portions of the semiconductor film.

2. The semiconductor device according to claim 1, wherein the portions of the pair of metal silicide regions are directly in contact with both of the first insulating film and the second insulating film.

3. The semiconductor device according to claim 1, wherein each of the pair of metal silicide regions is a silicide region of a metal selected from the group consisting of titanium, nickel, molybdenum, tungsten, platinum and palladium.

4. The semiconductor device according to claim 1, wherein the substrate is a glass substrate.

5. The semiconductor device according to claim 1, wherein the semiconductor film is a single crystalline semiconductor film.

6. The semiconductor device according to claim 1, wherein the semiconductor film is a polycrystalline semiconductor film.

7. The semiconductor device according to claim 1, wherein the semiconductor film is a semi-amorphous semiconductor film.

8. The semiconductor device according to claim 1, wherein the first insulating film is a silicon oxide film.

9. The semiconductor device according to claim 1, wherein the second insulating film is a silicon oxide film.

10. The semiconductor device according to claim 1, wherein the gate electrode comprises a material selected from the group consisting of aluminum, tantalum, titanium and silicon.

11. A semiconductor device comprising:
a substrate;
a first insulating film over the substrate;
a semiconductor film including silicon over the first insulating film, the semiconductor film comprising:
a pair of first impurity regions;
a pair of second impurity regions between the pair of first impurity regions; and
a channel region between the pair of second impurity regions;
a gate electrode over the channel region with a gate insulating film between the gate electrode and the channel region, the gate electrode partly overlapping each of the pair of second impurity regions; and
a second insulating film over the gate electrode,
wherein parts of a top surface portion and a side surface portion of the pair of first impurity regions are metal silicide regions, and
wherein an impurity concentration in the pair of first impurity regions is higher than an impurity concentration in the pair of second impurity regions.

12. The semiconductor device according to claim 11, wherein the metal silicide regions are directly in contact with both of the first insulating film and the second insulating film.

13. The semiconductor device according to claim 11, wherein each of the metal silicide regions is a silicide region of a metal selected from the group consisting of titanium, nickel, molybdenum, tungsten, platinum and palladium.

14. The semiconductor device according to claim 11, wherein the substrate is a glass substrate.

15. The semiconductor device according to claim 11, wherein the semiconductor film is a single crystalline semiconductor film.

16. The semiconductor device according to claim 11, wherein the semiconductor film is a polycrystalline semiconductor film.

17. The semiconductor device according to claim 11, wherein the semiconductor film is a semi-amorphous semiconductor film.

18. The semiconductor device according to claim 11, wherein the first insulating film is a silicon oxide film.

19. The semiconductor device according to claim 11, wherein the second insulating film is a silicon oxide film.

20. The semiconductor device according to claim 11, wherein the gate electrode comprises a material selected from the group consisting of aluminum, tantalum, titanium and silicon.

21. A semiconductor device comprising:
a substrate;
a first insulating film over the substrate;
first and second transistors over the first insulating film, each of the first and second transistors comprising:
a pair of metal silicide regions;
a pair of impurity regions between the pair of metal silicide regions;
a channel region between the pair of impurity regions; and
a gate electrode over the channel region with a gate insulating film between the gate electrode and the channel region, the gate electrode partly overlapping each of the pair of impurity regions, and
a second insulating film over the first and second transistors,
wherein one of the pair of metal silicide regions of the first transistor is directly in contact with one of the pair of metal silicide regions of the second transistor.

22. The semiconductor device according to claim 21, wherein each of the pair of metal silicide regions is a silicide region of a metal selected from the group consisting of titanium, nickel, molybdenum, tungsten, platinum and palladium.

23. The semiconductor device according to claim 21, wherein the substrate is a glass substrate.

24. The semiconductor device according to claim 21, wherein the first insulating film is a silicon oxide film.

25. The semiconductor device according to claim 21, wherein the second insulating film is a silicon oxide film.

26. The semiconductor device according to claim 21, wherein the gate electrode comprises a material selected from the group consisting of aluminum, tantalum, titanium and silicon.

27. The semiconductor device according to claim 21, wherein a conductive type of the first transistor is different from a conductive type of the second transistor.

* * * * *